(12) United States Patent
Kodaira et al.

(10) Patent No.: US 7,981,805 B2
(45) Date of Patent: Jul. 19, 2011

(54) METHOD FOR MANUFACTURING RESISTANCE CHANGE ELEMENT

(75) Inventors: Yoshimitsu Kodaira, Tama (JP); Tomoaki Osada, Fuchu (JP); Sanjay Shinde, San Jose, CA (US)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 12/852,230

(22) Filed: Aug. 6, 2010

(65) Prior Publication Data

US 2011/0021000 A1  Jan. 27, 2011

Related U.S. Application Data

(63) Continuation of application No. PCT/JP2009/053156, filed on Feb. 23, 2009.

(30) Foreign Application Priority Data

Feb. 22, 2008 (JP) .................................. 2008-041327

(51) Int. Cl.
*H01L 21/302* (2006.01)
*H01L 21/461* (2006.01)

(52) U.S. Cl. ......... 438/722; 257/E21.218; 257/E21.222; 438/707; 438/712

(58) Field of Classification Search ........... 257/E21.218, 257/E21.222; 438/707, 712, 722
See application file for complete search history.

(56) References Cited

U.S. PATENT DOCUMENTS

| | | | |
|---|---|---|---|
| 6,794,297 B2 * | 9/2004 | Noda ............................ | 438/706 |
| 2003/0176073 A1 | 9/2003 | Ying et al. ..................... | 438/710 |
| 2005/0016957 A1 * | 1/2005 | Kodaira et al. ................. | 216/67 |

FOREIGN PATENT DOCUMENTS

| | | |
|---|---|---|
| JP | 2003-282844 | 10/2003 |
| JP | 2005-314791 | 11/2005 |
| WO | WO 2007/108462 | 9/2007 |

OTHER PUBLICATIONS

International Search Report and Written Opinion, and International Preliminary Report on Patentability issued in International Application No. PCT/JP2009/053156 (15 pages).

* cited by examiner

*Primary Examiner* — Asok Sarkar
(74) *Attorney, Agent, or Firm* — Fitzpatrick, Cella, Harper & Scinto

(57) ABSTRACT

The present invention provides a method for manufacturing a resistance change element that can reduce occurrence of corrosion without increasing a substrate temperature. A laminate film that includes a high melting-point metal film and a metal oxide film, is etched using a mask under a plasma atmosphere formed using any one of a mixture gas formed by adding at least one gas selected from the group consisting of Ar, He, Xe, Ne, Kr, $O_2$, $O_3$, $N_2$, $H_2O$, $N_2O$, $NO_2$, CO and $CO_2$ to at least one kind of gasified compound selected from alcohol and hydrocarbon or the gas compound.

9 Claims, 3 Drawing Sheets

METHOD FOR MANUFACTURING RESISTANCE CHANGE ELEMENT

CROSS-REFERENCES TO RELATED APPLICATIONS

This application is a continuation application of International Application No. PCT/JP2009/053156, filed on Feb. 23, 2009, the entire contents of which are incorporated by reference herein.

This application also claims the benefit of priority from Japanese Patent Application No. 2008-041327 filed Feb. 22, 2008, the entire contents of which are incorporated herein by reference.

TECHNICAL FIELD

The present invention relates to a method for manufacturing a resistance change element that includes a high melting-point metal film and a metal oxide film, more specifically, it relates to a method for manufacturing a resistance change element including a step of microfabricating a high melting-point metal film and a metal oxide film by means of dry etching.

BACKGROUND ART

ReRAM (Resistance Random Access Memory, resistance change memory) has been paid attention as an indefinitely rewritable memory having an integration density comparable to that of DRAM and high-speed performance comparable to that of SRAM.

The above-mentioned ReRAM comprises a resistance change element including a laminate film that has a high melting-point metal film (electrode film) and a metal oxide film (resistance change film) changing its resistance reversibly in response to application of a voltage. Ion milling has often been used for etching processing of such a high melting-point metal film and a metal oxide film. Since ion milling is physical sputter etching, it has been however difficult for ion milling to ensure the selectivity with respect to various materials used for a mask, and thus problems such as film deposition on a sidewall have been occurred. Hence, in particular, ion milling is not suitable for manufacturing a large capacity resistance change memory requiring a microfabrication technology, and thus yield has not been improved so far.

Technologies developed in semiconductor industries have begun to replace such an ion milling technology. Among them, an RIE (Reactive Ion Etching) technology capable of ensuring uniformity for a large area substrate with a diameter of 300 mm and having an excellent microfabrication property has been expected.

RIE using a chlorine based gas has been utilized for etching of a high melting-point metal film and a metal oxide film. For the RIE using a chlorine based gas, because reactivity at room temperature is generally poor, it is difficult to process them without an etching residue and deposition on a sidewall, and thereby it is necessary to heat a substrate to a temperature of 250° C. or more so as to improve reactivity. The substrate temperature however cannot be made high because device damage will occur in the resistance change element at a high temperature, resulting in difficulty for RIE to obtain a good etched shape. Furthermore, it has been necessary for the conventional RIE to carry out corrosion processing after etching processing (refer to Patent Document 1).

Patent Document 1: Japanese Patent Application Laid-open No. 2003-282844

SUMMARY OF INVENTION

An object of the present invention is to provide a method for manufacturing a resistance change element that can reduce occurrence of corrosion without increasing a substrate temperature in the manufacture of a resistance change element.

Another object of the present invention is to provide a method for manufacturing a resistance change element, including a step of dry etching based on a high speed and a high selection ratio.

A first aspect of the present invention is a method for manufacturing a resistance change element, comprising an etching step of etching a laminate film that includes an electrode film and a resistance change film containing a metal oxide, under a plasma atmosphere formed by at least using at least one kind of gasified compound selected from alcohol and hydrocarbon and using a mask made of a non-organic material.

A second aspect of the present invention is a method for manufacturing a resistance change element including a laminate structure of a high melting-point metal film and a metal oxide film, the method comprising: a step of preparing a laminate film that includes a high melting-point metal film and a metal oxide film; and an etching step of etching the laminate film to form the laminate structure by, under a plasma atmosphere formed by at least using at least one kind of gasified compound selected from alcohol and hydrocarbon and using a mask against etching by the gasified compound.

Furthermore, a third aspect of the present invention is a method for manufacturing a resistance change element including a laminate structure of a high melting-point metal film and a metal oxide film, the method comprising: a placing step of placing a laminate film that includes a high melting-point metal film and a metal oxide film, in a chamber; a supply step of supplying an etching gas that at least contains at least one kind of gasified compound selected from alcohol and hydrocarbon, into the chamber; and an etching step of generating plasma in the chamber into which the etching gas is supplied, and etching the laminate film by the etching gas using a mask against etching by the etching gas under the plasma atmosphere, to form the laminate structure.

Furthermore, a fourth aspect of the present invention is an apparatus for manufacturing a resistance change element including a laminate structure of a high melting-point metal film and a metal oxide film, the apparatus comprising: a chamber; a member disposed inside the chamber, on which the laminate film that includes the high melting-point metal film and the metal oxide is placed; supply means for supplying an etching gas that at least contains at least one kind of gasified compound selected from alcohol and hydrocarbon, into the chamber; and plasma generation means for generating plasma in the chamber into which the etching gas is supplied, wherein in the step of forming the laminate structure, under the generated plasma atmosphere, etching by the etching gas is performed on the laminate film that is placed on the member and has a mask against etching by the etching gas formed thereon, to form the laminate structure.

According to the present invention, during etching the high melting-point metal film and the metal oxide film, occurrence of corrosion can be reduced and special consideration of corrosion resistance with respect to an etching apparatus is not necessary. Moreover, because it is not necessary to increase the substrate temperature, possibility of device damage due to heating can be reduced.

Furthermore, according to the present invention, because a high etching rate and a large selection ratio can be achieved, high grade microfabrication of a high melting point metal film and a metal oxide film can be achieved, enabling to significantly improve the yield of manufacture of a highly integrated resistance change memory.

DESCRIPTION OF EMBODIMENTS

Figure 1:
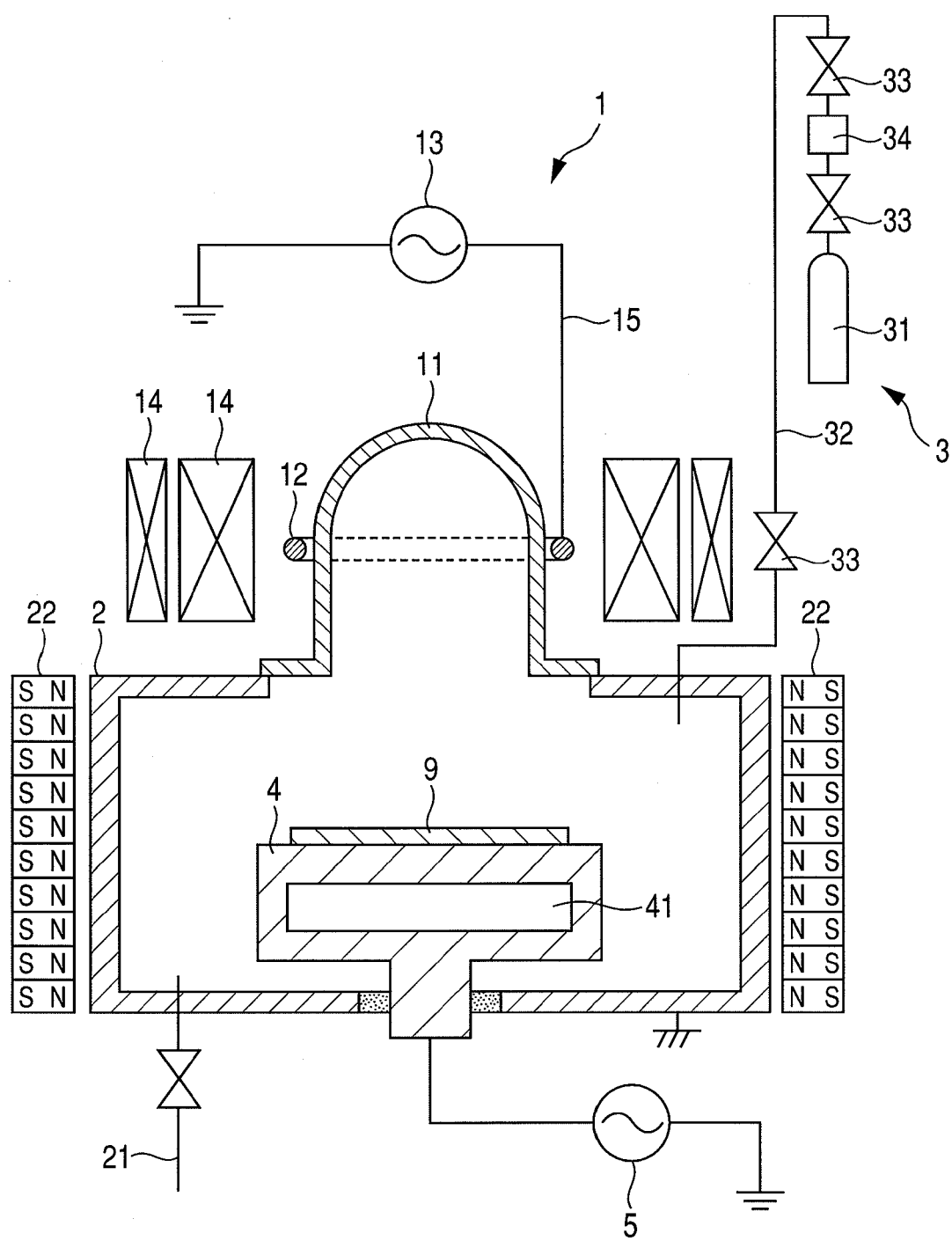
FIG. 1 is a schematic cross-sectional view illustrating a configuration of one example of an etching apparatus used for an etching step according to the present invention.

Hereinafter, with reference to drawings, embodiments of the present invention will be described in detail. In addition, in the below described drawings, elements having a same function are denoted by a same reference numeral and repeated descriptions thereof will be omitted.

A manufacturing method according to the present invention is characterized in that a specific etching gas is used in an etching step by means of RIE of etching a laminate film that includes a high melting-point metal film (electrode film) and a metal oxide film (resistance change film), both of which are constituent members of a resistance change element. Hence, according to the present invention, except for using such a specific etching gas, the same apparatus, member and step as those of a conventional etching step by means of RIE can be used.

Figure 2A:
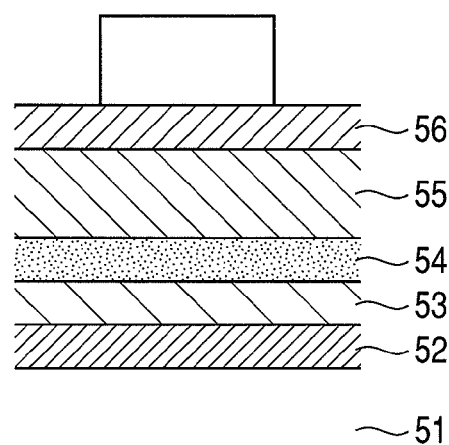
FIG. 2A is a schematic cross-sectional view illustrating one example of the etching step according to the present invention.
Figure 2B:
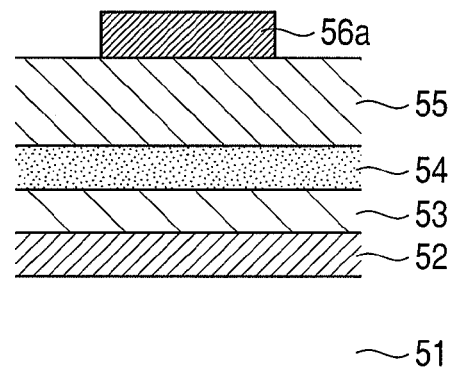
FIG. 2B is a schematic cross-sectional view illustrating another example of the etching step according to the present invention.
Figure 2C:
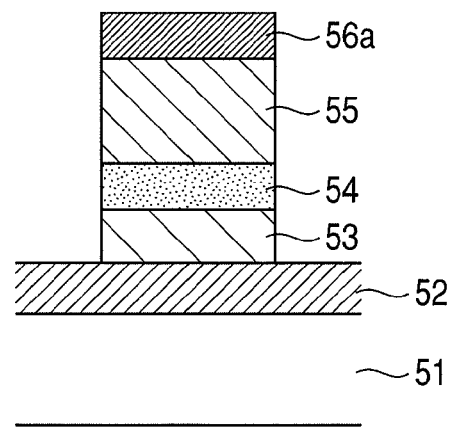
FIG. 2C is a schematic cross-sectional view illustrating further another example of the etching step according to the present invention.

FIGS. 2A to 2C are schematic cross-sectional views each illustrating one example of the etching step of the manufacturing method according to the present invention. In these figures, reference numeral 51 denotes a substrate; 52, an etching stopper layer; 53, a high melting-point metal film; 54, a metal oxide film; 55, a high melting-point metal film; 56, a mask material layer; 56a, a mask; and 57, a resist. FIG. 2C illustrates an example of a basic structure of a resistance change element, including a laminate structure that has the high melting-point metal films 53 and 55 sandwiching the metal oxide film 54 therebetween. The resistance change element manufactured according to the present invention has only to include such a basic structure that at least has the high melting point metal films and the metal oxide film as illustrated in FIG. 2C, and it is not limited to include the exact structure of FIG. 2C.

According to the present invention, as the high melting-point metal films 53 and 55, a single layer film of any one kind selected from Pt, Ru, Ir, Os, Au, Pd and Re, or a laminate film of two or more kinds selected from them, are preferably included.

As the metal oxide film 54, $Nb_2O_5$, $ZrO_2$, NiO, $PrCaMnO_3$, $SrZrO_3$ doped with Cr, $SrZrO_3$ doped with V, $PbZrTiO_3$, CuO, $LaNiO_3$, $HfO_x$, and $BiO_x$ are preferably included. These are used in a form of a single layer film of any one kind of them or a laminate film of two or more kinds of them.

As illustrated in FIG. 2A, in order to obtain such an element, the etching stopper layer 52 to the mask material layer 56 are laminated on the substrate 51, and the resist 57 for patterning the mask material layer 56 is formed thereon. Next, using the resist 57 as a mask, the mask material layer 56 is etched to pattern the mask 56a used for etching the high melting-point metal films 53 and 55 and the metal oxide film 54 (FIG. 2B).

Next, using the mask 56a, etching of the high melting-point metal films 53 and 55 and the metal oxide film 54 is performed (FIG. 2C). According to the present invention, a specific etching gas is used for the etching step. In other words, at least one kind of gasified compound selected from alcohol and hydrocarbon is used as the etching gas.

As the alcohol, at least one selected from a compound group consisting of methyl alcohol, ethyl alcohol, and isopropyl alcohol is preferably used.

As the hydrocarbon, at least one selected from a compound group consisting of methane, ethane, propane, ethylene and acetylene is preferably used.

Furthermore, according to the present invention, further to the gasified compound, at least one gas selected from the group consisting of Ar, He, Xe, Ne, Kr, $O_2$, $O_3$, $N_2$, $H_2O$, $N_2O$, $NO_2$, CO and $CO_2$ may be added. If the gasified compound selected from the alcohol and hydrocarbon is denoted as A, and the above-mentioned gas to be added to the compound is denoted as B, regarding the mixture rate in mixing these gases, B can be added to A up to 66% when A+B=100%.

As mentioned above, according to the present invention, as an etching gas for etching a laminate film made of a high melting-point metal film and a metal oxide film, a gas at least containing a gasified compound that includes at least one kind selected from alcohol and hydrocarbon, is used. Accordingly, because the laminate film can be etched even if a chlorine based gas is not used as the etching gas, after-corrosion processing and anti-corrosion processing for the etching apparatus can be made unnecessary.

As mentioned above, the important matter of the present invention is that a laminate film made of a high melting-point metal film and a metal oxide film can be etched well, therefore, according to the present invention, a gas at least containing at least one kind selected from alcohol and hydrocarbon is used as an etching gas. That is, according to the present invention, at least one kind selected from alcohol and hydrocarbon has a function of etching, and thus, the laminate film can be etched well regardless of presence of a chlorine based gas. Hence, occurrence of corrosion can be prevented or reduced, and after-corrosion processing may also be made unnecessary.

Moreover, according to the present invention, a non-organic material can be used for the mask material layer 56, specifically it is preferable to use a single layer film of any one kind selected from Ta, Ti, Al, Si and W or a laminate film of two or more kinds selected from them. Moreover, a single layer film of any one kind selected from oxides and nitrides of Ta, Ti, Al and Si or a laminate film of two or more kinds selected from them are also preferably included. These materials may also be preferably used for the etching stopper layer 52.

Such materials act as a mask with respect to alcohol and hydrocarbon. Hence, by using these materials for the mask material layer 56 in a case in which a gas at least containing a gasified compound of the present invention is used as an etching gas, etching of the mask material layer 56 can be favorably prevented, enabling to achieve a high selection ratio.

That is, the above-mentioned materials are ones that cannot be subjected to physical etching comparatively easily, or can be oxidized comparatively easily. For example, when alcohol is used for the etching gas, because the mask material is oxidized, the material (especially $TaO_x$) cannot be subjected to physical etching easily. Thus, a good selection ratio can be obtained. Moreover, when hydrocarbon is used for the etching gas, for example, because carbons are deposited on the mask material that cannot be subjected to physical etching easily, in a form of polymer etc., the material becomes harder to be subjected to physical etching. Thus, a good selection ratio can also be obtained in this case.

As the substrate 51, a wafer is preferably used.

According to the present invention, because a high temperature is not required for the substrate 51 during etching the high melting-point metal films 53 and 55 and the metal oxide film 54, etching can be performed favorably at a substrate temperature of less than 250° C. at which device damage does not occur. Preferably, the substrate temperature is 20 to 100° C.

That is, according to the present invention, as mentioned above, the basic structure of a resistance change element can be etched well without using a chlorine based gas. Hence, because it is not necessary to set the substrate temperature to 250° C. in order to improve the reactivity of the chlorine based gas, it is not necessary to set the substrate temperature high. That is, according to the present invention, because it is not necessary to set the substrate temperature to 250° C. or more in order to improve the reactivity of the etching gas, occurrence of device damage can be suppressed.

According to the present invention, etching of the high melting point metal films 53 and 55 and the metal oxide film 54, and etching of the mask material layer 56 to be performed earlier, can be performed continuously by using the same etching apparatus. One example of the etching apparatus used for the present invention is illustrated in FIG. 1.

FIG. 1 is a schematic cross-sectional view illustrating the configuration of an etching apparatus mounting an ICP (Inductive Coupled Plasma) plasma source therein. The above-mentioned etching step using this apparatus will be described.

The inside of a vacuum vessel 2 is exhausted by an exhaust system 21, a gate valve (not illustrated in the figure) is opened to carry a substrate (wafer) 9 having the laminate structure of FIG. 2A into the vacuum vessel 2, the substrate is held with a substrate holder 4, and the substrate is kept at a predetermined temperature by a temperature control mechanism 41.

Next, a gas introduction system 3 is operated and an etching gas having a predetermined flow rate is introduced into the vacuum vessel 2 from a gas cylinder 31 in which the etching gas is accumulated, through a piping 32, a valve 33, and a flow-rate controller 34. The introduced etching gas diffuses into a dielectric wall container 11 via the inside of the vacuum vessel 2. Here, plasma is generated in the vacuum vessel 2.

The mechanism for generating plasma includes: the dielectric wall container 11; an one-turn antenna 12 for generating an induction magnetic field in the dielectric wall container 11; a high frequency power source 13 for plasma; an electromagnet 14 for causing the dielectric wall container 11 to possess a predetermined magnetic field therein; and the like. The dielectric wall container 11 is air-tightly connected to the vacuum vessel 2 so that the inner spaces thereof communicate with each other, and the high frequency power source 13 for plasma is connected to the antenna 12 via a matching box (not illustrated in the figure) by a transmission line 15.

In the above-mentioned configuration, when a high frequency wave generated by the high frequency power supply 13 for plasma is supplied to the one-turn antenna 12 by the transmission line 15, current flows inside the antenna 12, and as a result, plasma is generated inside the dielectric wall container 11.

In addition, a large number of sidewall magnets 22 are aligned and arranged in the circumference direction of the vacuum vessel 2 outside the sidewall of the vacuum vessel 2 so that neighboring magnets located on a plane facing the side wall of the vacuum vessel 2 have different magnetic poles. By this configuration, cusped magnetic fields are formed serially in the circumference direction of the vacuum vessel 2 along the inner surface of the side wall of the vacuum vessel 2, and thus the plasma is prevented from diffusing into the inner surface of the side wall of the vacuum vessel 2.

At that time, ion incidence energy from plasma to the surface of the substrate 9 is controlled at the same time by operating a high frequency power supply 5 for biasing and applying a self bias voltage that is the voltage of negative DC current to the substrate 9 that is a target object to be etched. The plasma formed as mentioned above diffuses into the vacuum vessel 2 from the dielectric wall container 11, and reaches the vicinity of the surface of the substrate 9, and thus the surface of the substrate 9 is etched under the plasma atmosphere.

According to the present invention, the apparatus of FIG. 1 can continuously perform etching of the mask material layer 56 and etching of the high melting-point metal layers 53 and 55 and the metal oxide film 54 by changing etching gases. $CF_4$ gas is preferably used for etching of the mask material layer 56.

In addition, according to the present invention, it is also possible to perform etching of the mask material layer 56 and etching of the high melting-point metal layers 53 and 55 and the metal oxide film 54 separately, instead of performing etching of them continuously. In this case, etching of the high melting-point metal layers 53 and 55 and the metal oxide film 54 may be performed by placing a laminate film of the high melting-point metal films 53 and 55 and the metal oxide film 54 on the substrate holder 4, wherein, as illustrated in FIG. 2B, the mask 56 is already formed separately on the laminate film.

First Embodiment

According to the present embodiment, a resistance change element was manufactured by etching the laminate structure illustrated in FIGS. 2A to 2C using the apparatus of FIG. 1.

A wafer was used as the substrate 51, the etching stopper layer 52 and the mask material layer 56 were configured with TiN, the high melting-point metal films 53 and 55 were configured with Pt, and the metal oxide film 54 was configured with $PrCaMnO_3$. Moreover, thicknesses of the etching stopper layer 52, the high melting point metal film 53, the metal oxide film 54, the high melting-point metal film 55, and the mask material layer 56 were set to be 150 Å, 250 Å, 250 Å, 500 Å, and 300 Å, respectively.

The etching conditions of the mask material layer 56 were as follows: flow rate of the etching gas ($CF_4$), 326 mg/min (50 sccm); source electric power, 500 W; bias electric power, 60 W; pressure in the vacuum vessel 2, 0.6 Pa; and temperature of the substrate holder 4, 80° C.

The etching conditions of the high melting-point metal films 53 and 55 and the metal oxide film 54 were as follows: flow rate of the etching gas ($CH_3OH$ gas), 18.75 mg/min (15 sccm); source electric power, 1500 W; bias electric power, 600 W; pressure in the vacuum vessel 2, 0.4 Pa; and temperature of the substrate holder 4, 40° C.

Figure 3A:
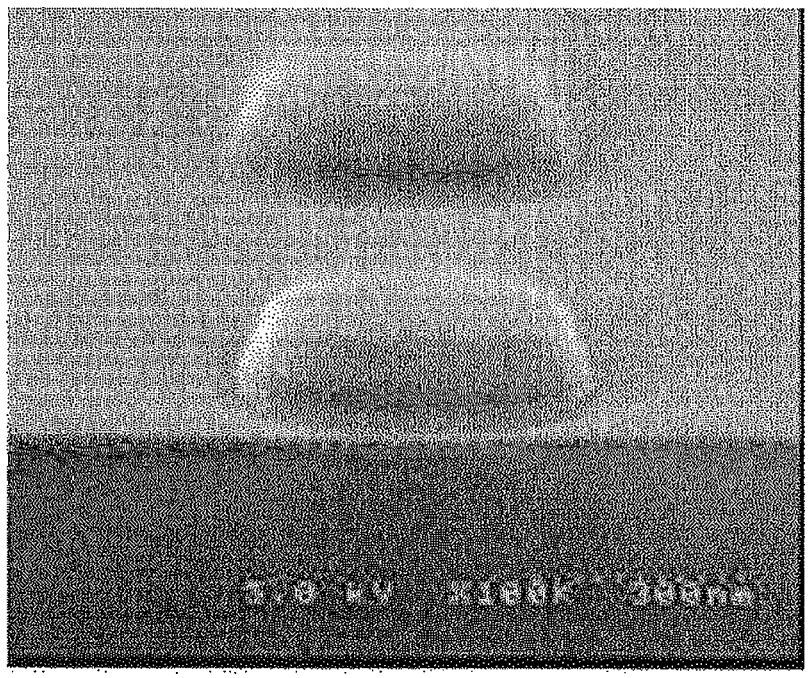
FIG. 3A is a SEM (scanning electron microscope) photograph illustrating a shape of the resistance change element of one embodiment according to the present invention.
Figure 3B:
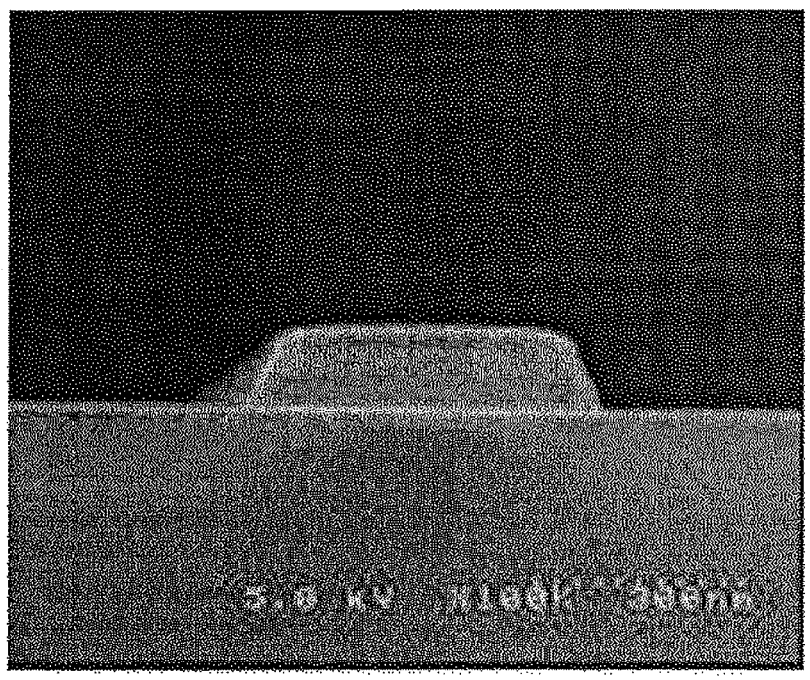
FIG. 3B is a SEM photograph illustrating another shape of the resistance change element of another embodiment according to the present invention.

Each of FIGS. 3A and 3B illustrates a SEM (Scanning Electron Microscope) photograph of the shape of the resistance change element after subjected to the above-mentioned etching. FIG. 3A is a downward view, and FIG. 3B is a front view. As is clear from FIGS. 3A and 3B, according to the present invention, because $CH_3OH$ was used as the etching gas of the high melting-point metal films and the metal oxide film, it is understood that the films are finely etched without a residue.

In addition, as for the case of $PrCaMnO_3$, an etching rate of 7.23 nm/min and a selection ratio of 1.74 with respect to a TiN mask were obtained.

Second Embodiment

A resistance change element was manufactured by the same way as that of First Embodiment except for using $LaNiO_3$ instead of $PrCaMnO_3$ as the metal oxide film 54 and using a mixture (1:1) gas of $CH_3OH$ and Ar as the etching gas of a $LaNiO_3$ film and a Pt film.

As a result, as for the case of $LaNiO_3$, an etching rate of 16 nm/min and a selection ratio of 2.52 with respect to the TiN mask were obtained. $LaNiO_3$ was finely etched without a residue.

Third Embodiment

Ru was used for the high melting-point metal films 53 and 55, and NiO was used for the metal oxide film 54. A resistance change element was manufactured by the same way as that of First Embodiment except for using a mixture (1:1) gas of $CH_3OH$ and Ar as the etching gas in an etching step of a laminate film of a NiO film and Ru films and setting the bias electric power to be 1200 W.

As a result, as for the case of NiO, an etching rate of 51.7 nm/min and a selection ratio of 8.14 with respect to the TiN mask were obtained. NiO was finely etched without a residue.

The invention claimed is:

1. A method for manufacturing a resistance change element comprising:
an etching step of etching a laminate film that includes an electrode film and a resistance change film containing a metal oxide, under a plasma atmosphere formed by at least using gasified compound of alcohol, using a mask made of a non-organic material,
wherein the alcohol is at least one selected from a compound group consisting of methyl alcohol, ethyl alcohol, and isopropyl alcohol.

2. A method for manufacturing a resistance change element according to claim 1, wherein the plasma atmosphere is formed by further adding at least one gas selected from the group consisting of Ar, He, Xe, Ne, Kr, $O_2$, $O_3$, $N_2$, $H_2O$, $N_2O$, $NO_2$, CO and $CO_2$ to the gasified compound.

3. A method for manufacturing a resistance change element according to claim 1, wherein the mask made of a non-organic material is made of a single layer film of any one kind selected from Ta, Ti, Al, Si and W or a laminate film of two or more kinds selected from them, or made of a single layer film of any one kind selected from oxides and nitrides of Ta, Ti, Al and Si or a laminate film of two or more kinds selected from them.

4. A method for manufacturing a resistance change element according to claim 1, wherein the electrode film is made of a single layer film of any one kind selected from Pt, Ru, Ir, Os, Au, Pd and Re, or a laminate film of two or more kinds selected from them.

5. A method for manufacturing a resistance change element according to claim 1, wherein the metal oxide film is made of a single layer film of any one kind selected from $Nb_2O_5$, $ZrO_2$, NiO, $PrCaMnO_3$, $SrZrO_3$ doped with Cr, $SrZrO_3$ doped with V, $PbZrTiO_3$, CuO, $LaNiO_3$, $HfO_x$, and $BiO_x$ or a laminate film of two or more kinds selected from them.

6. A method for manufacturing a resistance change element according to claim 1, wherein the substrate temperature in the etching step is less than 250° C.

7. A method for manufacturing a resistance change element according to claim 1, wherein the substrate temperature in the etching step is 20 to 100° C.

8. A method for manufacturing a resistance change element comprising:
an etching step of etching a laminate film that includes an electrode film and a resistance change film containing a metal oxide, under a plasma atmosphere of gasified compound of alcohol and an Ar gas, using a mask made of a non-organic material,
wherein the alcohol is at least one selected from a compound group consisting of methyl alcohol, ethyl alcohol, and isopropyl alcohol.

9. A method for processing a laminate film comprising:
an etching step of etching a laminate film that includes an electrode film and a resistance change film containing a metal oxide, under a plasma atmosphere formed by at least using gasified compound of alcohol, using a mask made of a non-organic material,
wherein the alcohol is at least one selected from a compound group consisting of methyl alcohol, ethyl alcohol, and isopropyl alcohol.

* * * * *